(12) United States Patent
Drogi

(10) Patent No.: US 12,143,132 B2
(45) Date of Patent: Nov. 12, 2024

(54) POWER AMPLIFIER SYSTEMS WITH NON-LINEAR ANTENNA IMPEDANCE FOR LOAD COMPENSATION

(71) Applicant: Skyworks Solutions, Inc., Irvine, CA (US)

(72) Inventor: Serge Francois Drogi, Flagstaff, AZ (US)

(73) Assignee: Skyworks Solutions, Inc., Irvine, CA (US)

( * ) Notice: Subject to any disclaimer, the term of this patent is extended or adjusted under 35 U.S.C. 154(b) by 353 days.

(21) Appl. No.: 17/653,691

(22) Filed: Mar. 7, 2022

(65) Prior Publication Data

US 2022/0302935 A1    Sep. 22, 2022

Related U.S. Application Data

(60) Provisional application No. 63/200,615, filed on Mar. 18, 2021.

(51) Int. Cl.
| | |
|---|---|
| *H04B 1/04* | (2006.01) |
| *H01Q 1/24* | (2006.01) |
| *H03F 3/193* | (2006.01) |
| *H03F 3/21* | (2006.01) |
| *H04B 1/18* | (2006.01) |

(52) U.S. Cl.
CPC ............... *H04B 1/04* (2013.01); *H01Q 1/243* (2013.01); *H03F 3/193* (2013.01); *H03F 3/21* (2013.01); *H04B 1/18* (2013.01); *H03F 2200/387* (2013.01); *H04B 2001/0408* (2013.01)

(58) Field of Classification Search
CPC ...... H01Q 1/243; H01Q 9/0407; H03F 1/025; H03F 1/0255; H03F 1/0266; H03F 1/0272; H03F 1/3247; H03F 1/56; H03F 2200/387; H03F 3/19; H03F 3/193; H03F 3/21; H03F 3/245; H04B 1/04; H04B 1/18; H04B 2001/0408
USPC ......................................................... 455/522
See application file for complete search history.

(56) References Cited

U.S. PATENT DOCUMENTS

| | | | |
|---|---|---|---|
| 3,754,250 A | * | 8/1973 | Bruner .................... G08C 17/02 342/44 |
| 4,471,344 A | | 9/1984 | Williams |
| 4,700,179 A | | 10/1987 | Fancher |
| 5,678,209 A | * | 10/1997 | Strakovsky .......... H03G 3/3042 455/127.2 |
| 5,741,979 A | | 4/1998 | Arndt et al. |
| 6,008,760 A | | 12/1999 | Shattil |
| 6,144,299 A | | 11/2000 | Cole |
| 6,882,868 B1 | | 4/2005 | Shattil |

(Continued)

*Primary Examiner* — Tan H Trinh
(74) *Attorney, Agent, or Firm* — Knobbe, Martens, Olson & Bear, LLP

(57) ABSTRACT

Power amplifier systems with non-linear antenna impedance for load compensation are provided. In certain embodiments, a method of power amplification in a mobile device is provided. The method includes generating a radio frequency input signal using a transceiver, amplifying the radio frequency input signal to generate a radio frequency output signal using a power amplifier, and transmitting the radio frequency output signal using an antenna, including compensating the power amplifier for a change in output load in response to a change in signal power using a non-linear impedance versus output power characteristic of the antenna.

20 Claims, 12 Drawing Sheets

(56) References Cited

U.S. PATENT DOCUMENTS

| | | | |
|---|---|---|---|
| 6,895,226 B1* | 5/2005 | Forster | G06K 19/0723 |
| | | | 340/10.33 |
| 6,965,279 B2 | 11/2005 | Carson | |
| 7,283,799 B2 | 10/2007 | Shattil | |
| 7,477,921 B2 | 1/2009 | Shattil | |
| 8,190,109 B2 | 5/2012 | Ali et al. | |
| 8,774,743 B2 | 7/2014 | Ali et al. | |
| 9,331,723 B2 | 5/2016 | Ali et al. | |
| 9,479,130 B2 | 10/2016 | Sheynman et al. | |
| 9,680,217 B2 | 6/2017 | Ali et al. | |
| 9,819,088 B2 | 11/2017 | Lai et al. | |
| 10,033,105 B2 | 7/2018 | Lai et al. | |
| 10,469,121 B2 | 11/2019 | Hurwitz et al. | |
| 2003/0179126 A1* | 9/2003 | Jablonski | G01S 7/411 |
| | | | 342/90 |
| 2014/0119197 A1* | 5/2014 | Maca | H04B 17/14 |
| | | | 370/241 |
| 2014/0306761 A1* | 10/2014 | Fujiwara | H03F 1/223 |
| | | | 330/277 |
| 2015/0097624 A1* | 4/2015 | Olson | H03F 1/223 |
| | | | 330/295 |
| 2016/0111894 A1* | 4/2016 | Bishtein | H03F 3/2171 |
| | | | 307/104 |
| 2016/0313419 A1 | 10/2016 | Vernickel et al. | |
| 2018/0331659 A1* | 11/2018 | Khesbak | H03F 3/245 |
| 2018/0358708 A1 | 12/2018 | Ben-Bassat | |
| 2019/0372630 A1* | 12/2019 | Brunel | H04W 52/42 |
| 2020/0228064 A1* | 7/2020 | Datta | H04B 1/40 |
| 2022/0006198 A1 | 1/2022 | Edwards et al. | |
| 2022/0037123 A1* | 2/2022 | Zhang | H03F 1/0222 |
| 2022/0060200 A1* | 2/2022 | Mohammadi | H03H 11/20 |

* cited by examiner

POWER AMPLIFIER SYSTEMS WITH NON-LINEAR ANTENNA IMPEDANCE FOR LOAD COMPENSATION

CROSS-REFERENCE TO RELATED APPLICATIONS

This application claims the benefit of priority under 35 U.S.C. § 119 of U.S. Provisional Patent Application No. 63/200,615, filed Mar. 18, 2021 and titled "POWER AMPLIFIER SYSTEMS WITH NON-LINEAR ANTENNA IMPEDANCE FOR LOAD COMPENSATION," which is herein incorporated by reference in its entirety.

BACKGROUND

Field

Embodiments of the invention relate to electronic systems, and in particular, to radio frequency (RF) electronics.

Description of the Related Technology

Radio frequency (RF) communication systems wirelessly communicate RF signals using antennas.

Examples of RF communication systems that utilize antennas for communication include, but are not limited to mobile phones, tablets, base stations, network access points, laptops, and wearable electronics. RF signals have a frequency in the range from about 30 kHz to 300 GHz, for instance, in the range of about 425 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

SUMMARY

In certain embodiments, the present disclosure relates to a mobile device. The mobile device includes a transceiver configured to generate a radio frequency input signal, a front end system including a power amplifier configured to amplify the radio frequency input signal to generate a radio frequency output signal, and an antenna configured to transmit the radio frequency output signal, the antenna having a non-linear impedance versus output power characteristic operable to compensate the power amplifier for a change in output load in response to a change in signal power.

In some embodiments, the antenna is a patch antenna implemented to provide the non-linear impedance versus output power characteristic.

In various embodiments, the non-linear impedance of the antenna monotonically increases with a power level of the power amplifier.

In several embodiments, the mobile device further includes a power management system operable to provide a power amplifier supply voltage to the power amplifier. According to a number of embodiments, the power management system is further operable to control the power amplifier supply voltage to track an average power of the radio frequency input signal. In accordance with some embodiments, the power management system is further operable to control the power amplifier supply voltage based on an envelope of the radio frequency input signal.

In various embodiments, the method further includes an antenna array including the antenna. According to a number of embodiments, the front end system is configured to provide a plurality of radio frequency output signals to the antenna array to form a transmit beam.

In some embodiments, the antenna includes an antenna element and a controllable capacitor connected to the antenna element. According to a number of embodiments, the transceiver is configured to adjust a capacitance of the controllable capacitor to provide the non-linear impedance versus output power characteristic. In accordance with several embodiments, the antenna further includes a controllable voltage source in series with the controllable capacitor, the transceiver including a digital pre-distortion system configured to shape a digital representation of the radio frequency input signal and to adjust a voltage level of the controllable voltage source. According to various embodiments, the controllable capacitor is a varactor.

In several embodiments, the front end system further includes a transmission line connected between an output of the power amplifier and the antenna, and an imaginary impedance component of the transmission line is matched to an impedance of the antenna.

In certain embodiments, the present disclosure relates to a method of power amplification in a mobile device. The method includes generating a radio frequency input signal using a transceiver, amplifying the radio frequency input signal to generate a radio frequency output signal using a power amplifier, and transmitting the radio frequency output signal using an antenna, including compensating the power amplifier for a change in output load in response to a change in signal power using a non-linear impedance versus output power characteristic of the antenna.

In various embodiments, the antenna is a patch antenna.

In several embodiments, the method further includes monotonically increasing the non-linear impedance of the antenna with a power level of the power amplifier. According to a number of embodiments, the method further includes providing a power amplifier supply voltage to the power amplifier from a power management system. In accordance with some embodiments, the power management system is further operable to control the power amplifier supply voltage to track an average power of the radio frequency input signal. According to various embodiments, the power management system is further operable to control the power amplifier supply voltage based on an envelope of the radio frequency input signal.

In several embodiments, an antenna array includes the antenna, and the method further includes providing a plurality of radio frequency output signals to the antenna array to form a transmit beam.

In certain embodiments, the present disclosure relates to a radio frequency module. The radio frequency module includes a package substrate, a semiconductor die attached to the package substrate and including a power amplifier configured to amplify the radio frequency input signal to generate a radio frequency output signal, and an antenna attached to the package substrate and configured to transmit the radio frequency output signal, the antenna having a non-linear impedance versus output power characteristic operable to compensate the power amplifier for a change in output load in response to a change in signal power.

In various embodiments, the antenna is a patch antenna implemented to provide the non-linear impedance versus output power characteristic.

In several embodiments, the non-linear impedance of the antenna monotonically increases with a power level of the power amplifier.

In a number of embodiments, the radio frequency module further includes an antenna array attached to the package substrate, the antenna array including the antenna. According to a number of embodiments, the semiconductor die is configured to provide a plurality of radio frequency output signals to the antenna array to form a transmit beam.

DETAILED DESCRIPTION OF EMBODIMENTS

Figure 1:
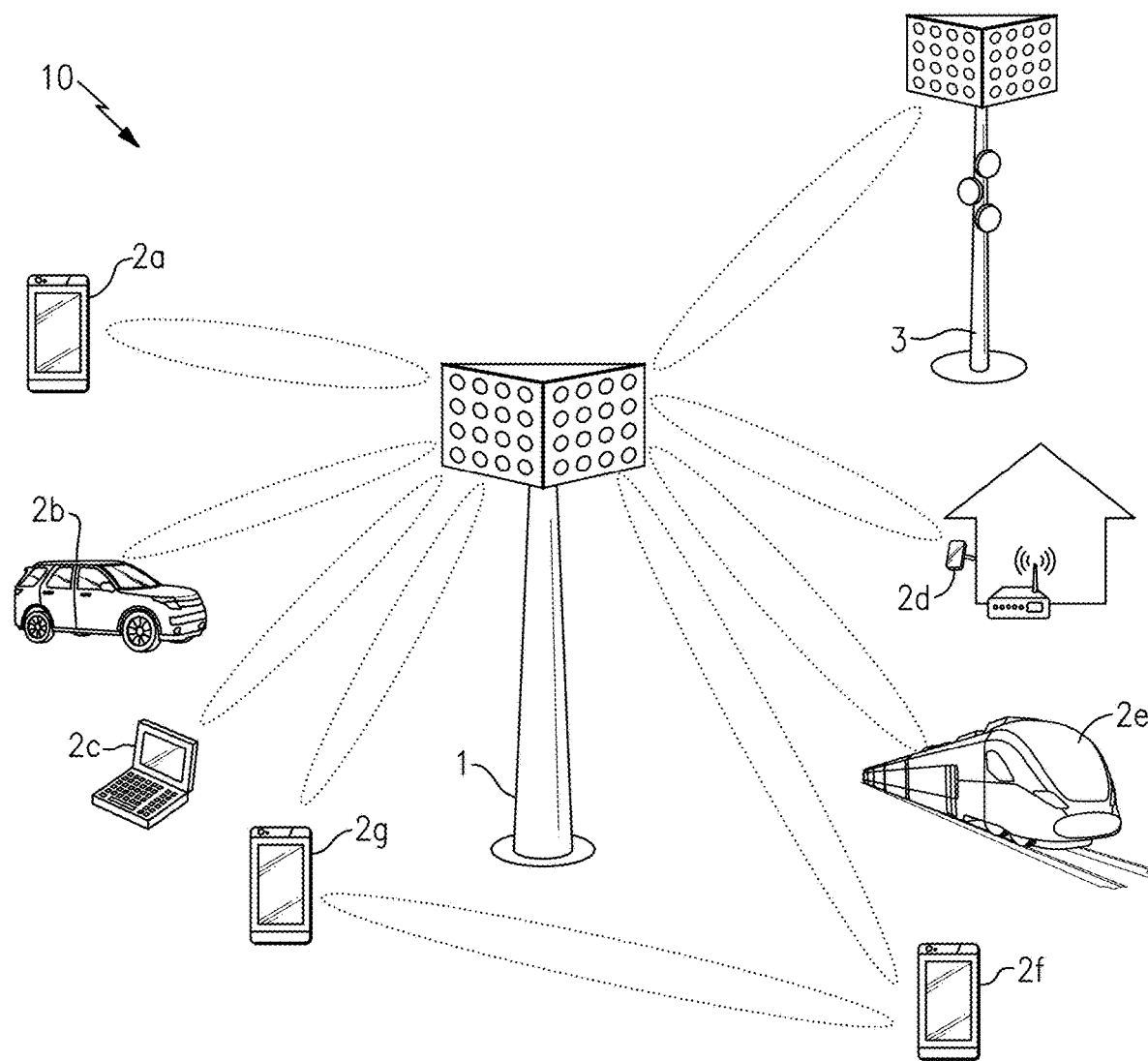
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
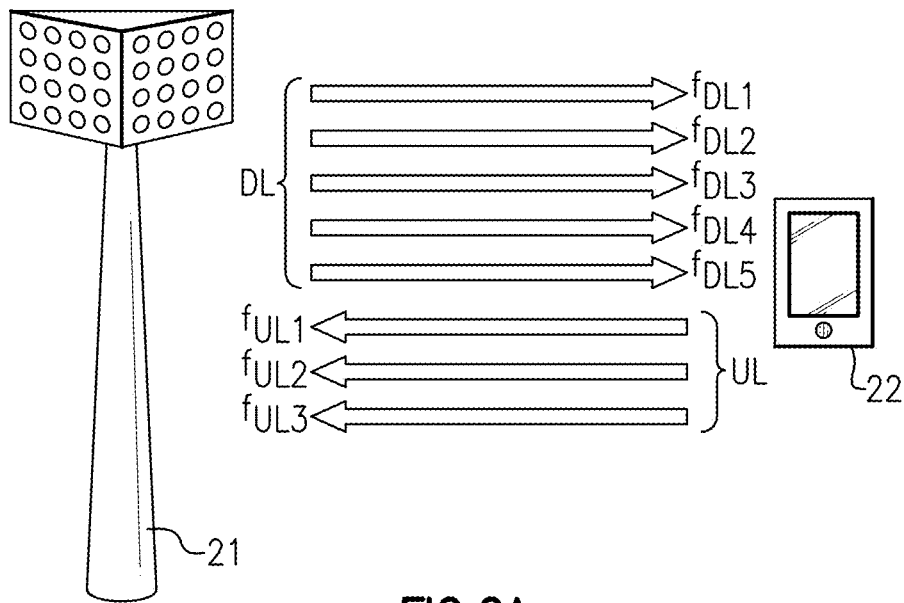
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
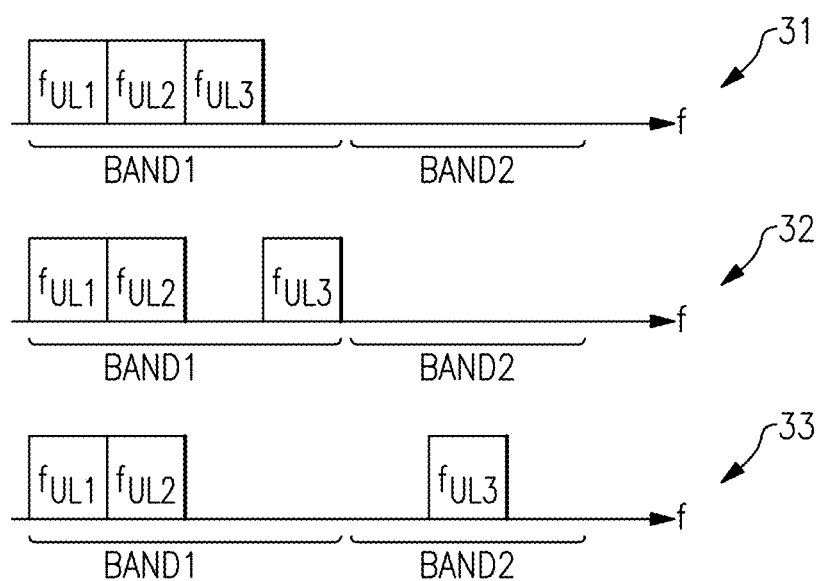
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
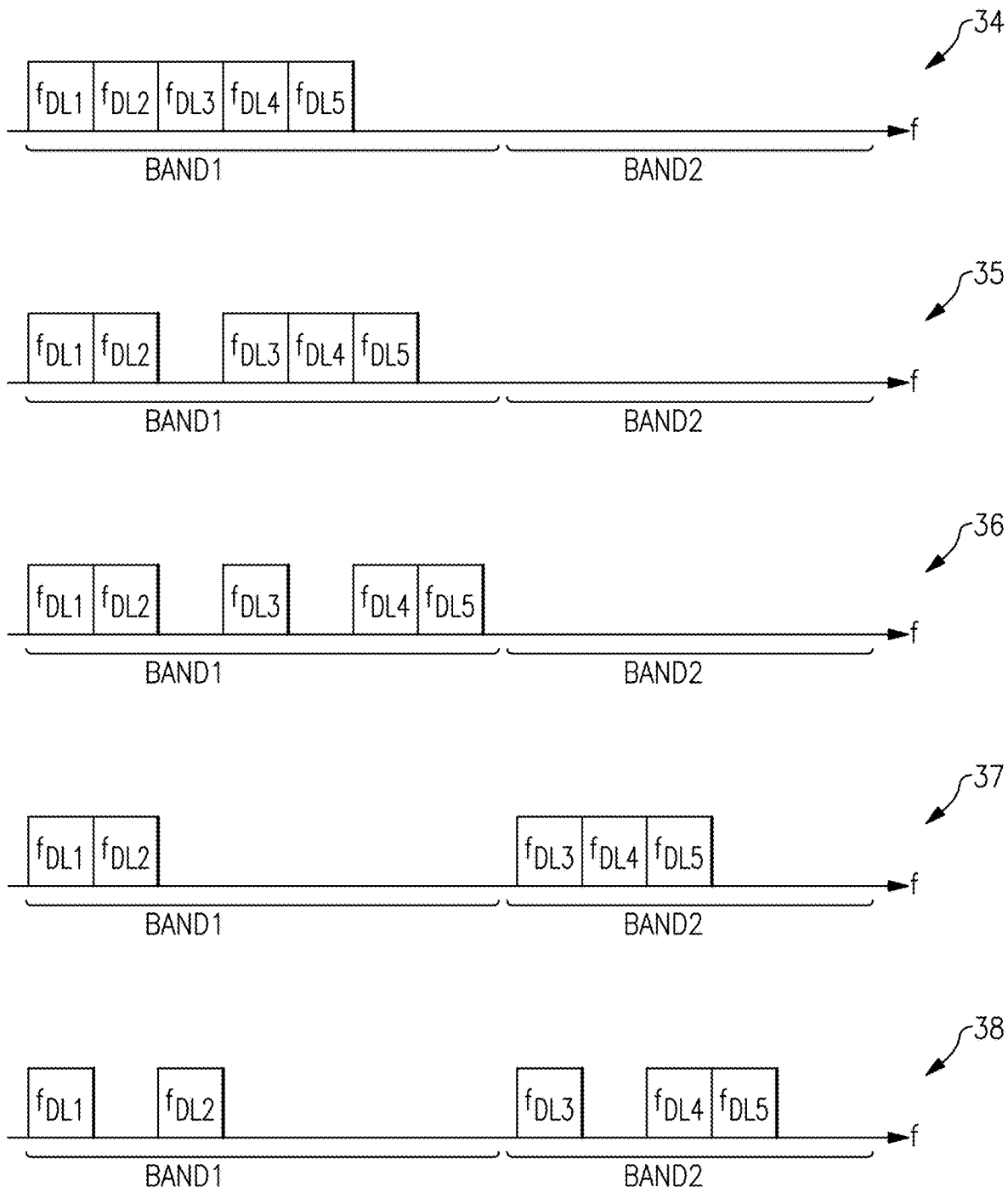
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink.

Figure 3A:
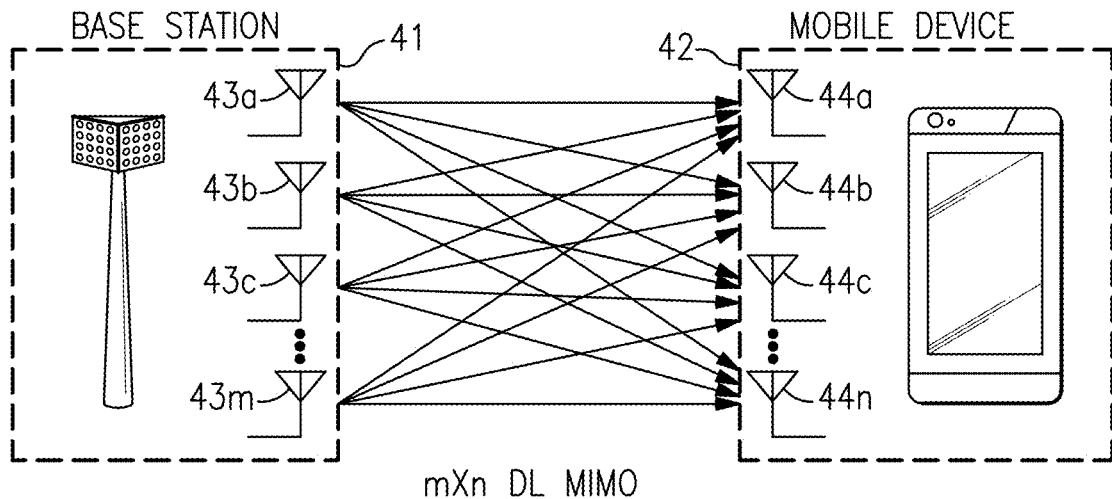
FIG. 3A is a schematic diagram of one example of a downlink channel using multi-input and multi-output (MIMO) communications.
Figure 3B:
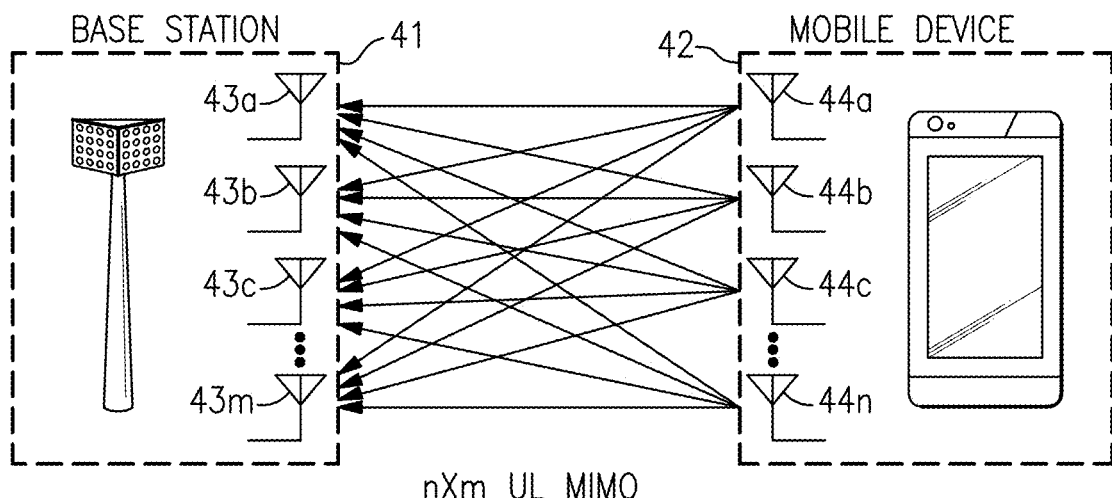
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas $43a$, $43b$, $43c$, ... $43m$ of the base station 41 and receiving using N antennas $44a$, $44b$, $44c$, ... $44n$ of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas $44a$, $44b$, $44c$, ... $44n$ of the mobile device 42 and receiving using M antennas $43a$, $43b$, $43c$, ... $43m$ of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
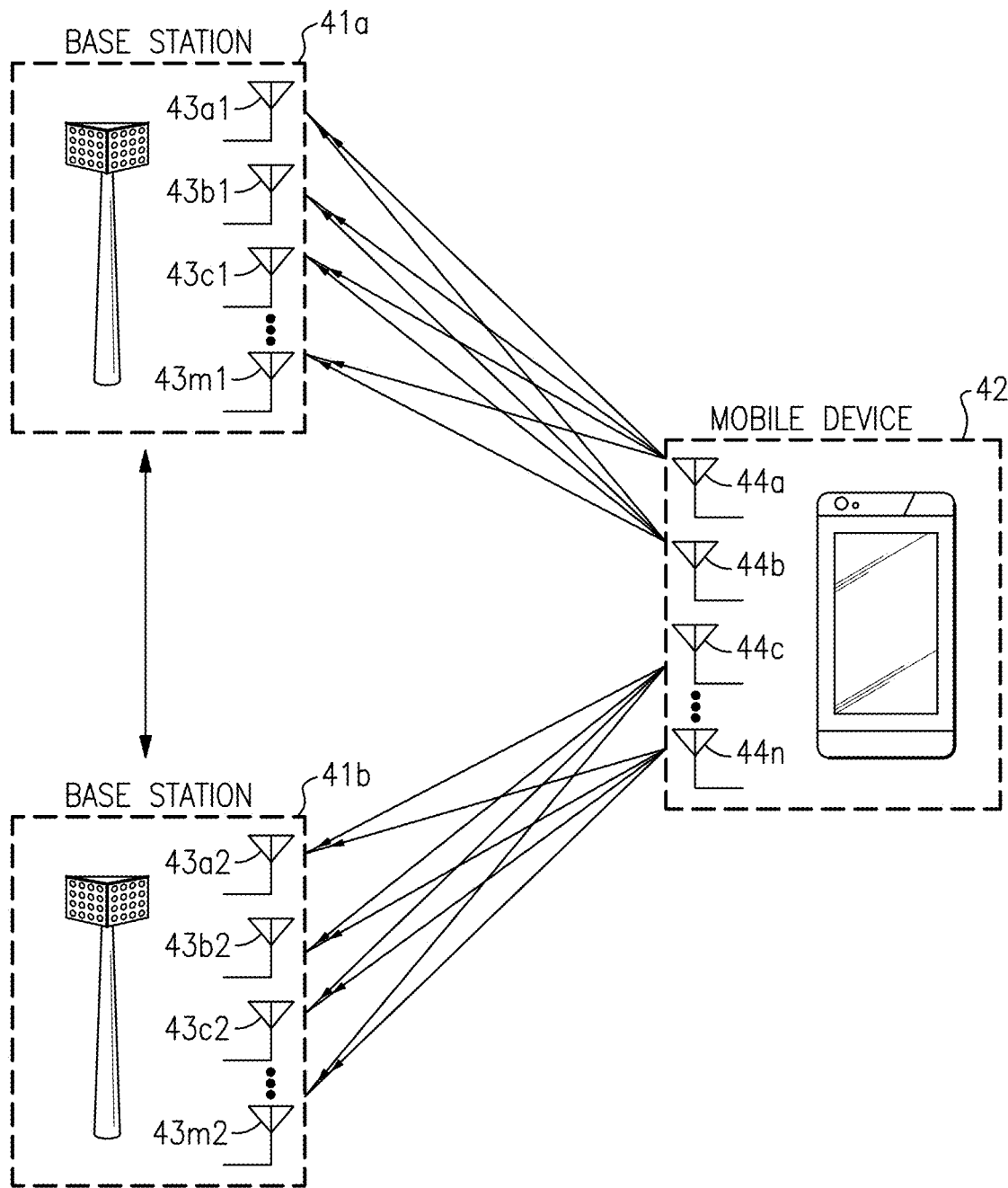
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas $44a$, $44b$, $44c$, ... $44n$ of the mobile device 42. Additional a first portion of the uplink transmissions are received using M antennas $43a1$, $43b1$, $43c1$, ... $43m1$ of a first base station $41a$, while a second portion of the uplink transmissions are received using M antennas $43a2$, $43b2$, $43c2$, ... $43m2$ of a second base station $41b$. Additionally, the first base station $41a$ and the second base station $41b$ communication with one another over wired, optical, and/or wireless links.

The MIMO scenario of FIG. 3C illustrates an example in which multiple base stations cooperate to facilitate MIMO communications.

Figure 4A:
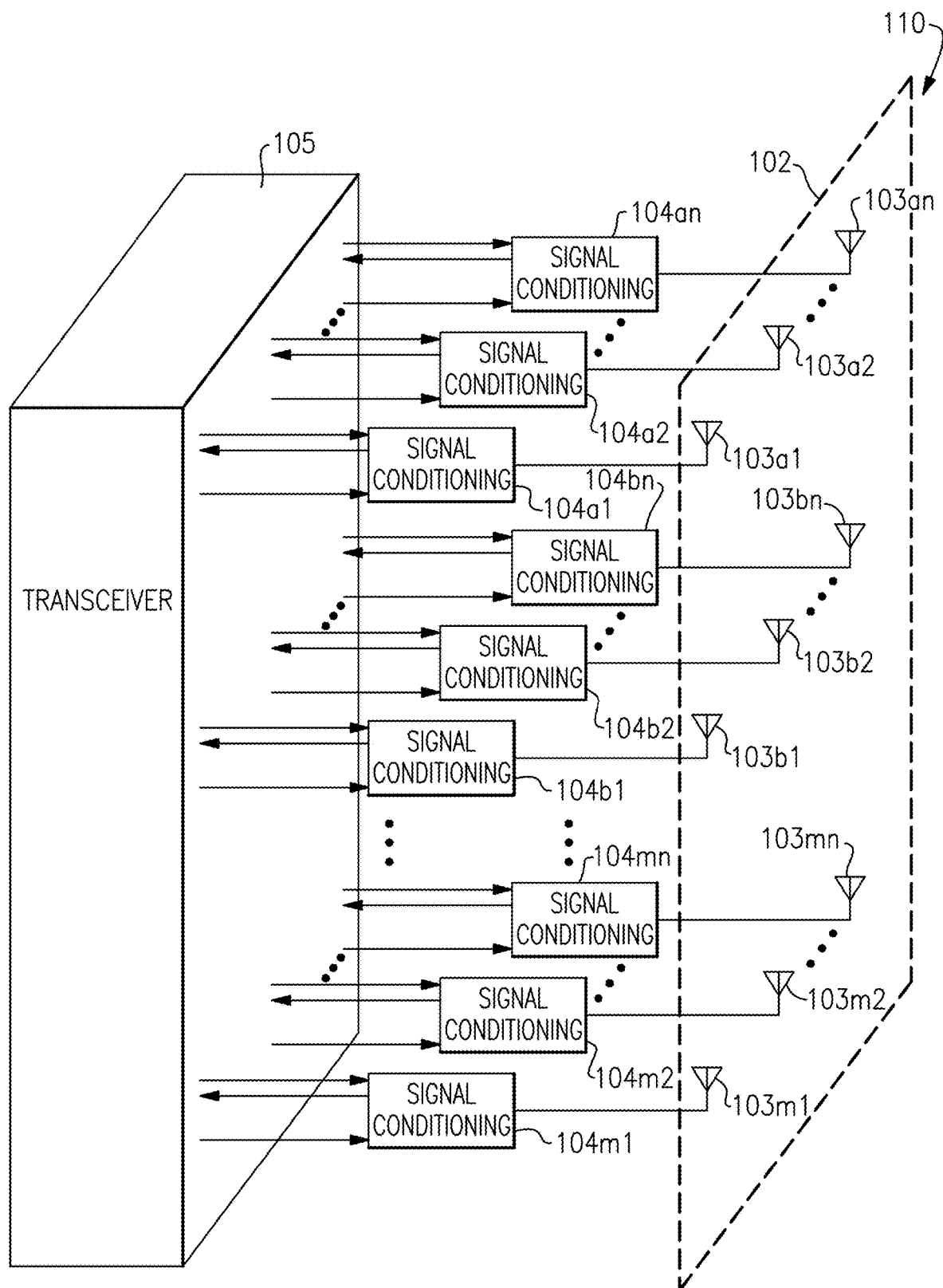
FIG. 4A is a schematic diagram of one example of a communication system that operates with beamforming.

FIG. 4A is a schematic diagram of one example of a communication system 110 that operates with beamforming. The communication system 110 includes a transceiver 105, signal conditioning circuits $104a1$, $104a2$ ... $104an$, $104b1$, $104b2$ ... $104bn$, $104m1$, $104m2$ ... $104mn$, and an antenna array 102 that includes antenna elements $103a1$, $103a2$ ... $103an$, $103b1$, $103b2$ ... $103bn$, $103m1$, $103m2$ ... $103mn$.

Communications systems that communicate using millimeter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits and processes signals received from the signal conditioning circuits. As shown in FIG. 4A, the transceiver 105 generates control signals for the signal conditioning circuits. The control signals can be used for a variety of functions, such as controlling the gain and phase of transmitted and/or received signals to control beamforming.

Figure 4B:
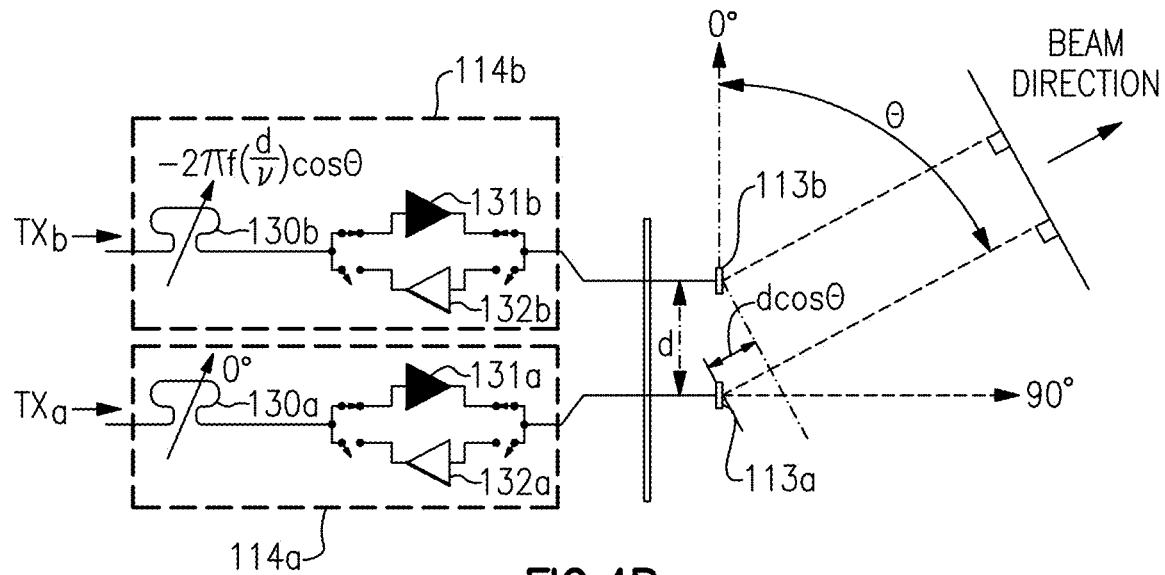
FIG. 4B is a schematic diagram of one example of beamforming to provide a transmit beam.

FIG. 4B is a schematic diagram of one example of beamforming to provide a transmit beam. FIG. 4B illustrates a portion of a communication system including a first signal conditioning circuit $114a$, a second signal conditioning circuit $114b$, a first antenna element $113a$, and a second antenna element $113b$.

Although illustrated as included two antenna elements and two signal conditioning circuits, a communication system can include additional antenna elements and/or signal conditioning circuits. For example, FIG. 4B illustrates one embodiment of a portion of the communication system 110 of FIG. 4A.

The first signal conditioning circuit $114a$ includes a first phase shifter $130a$, a first power amplifier $131a$, a first low noise amplifier (LNA) $132a$, and switches for controlling selection of the power amplifier $131a$ or LNA $132a$. Additionally, the second signal conditioning circuit $114b$ includes a second phase shifter 130b, a second power amplifier 131b, a second LNA 132b, and switches for controlling selection of the power amplifier 131b or LNA 132b.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113a and the second antenna element 113b are separated by a distance d. Additionally, FIG. 4B has been annotated with an angle θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113a, 113b, a desired transmit beam angle θ can be achieved. For example, when the first phase shifter 130a has a reference value of 0°, the second phase shifter 130b can be controlled to provide a phase shift of about $-2\pi f(d/v)\cos\theta$ radians, where f is the fundamental frequency of the transmit signal, d is the distance between the antenna elements, v is the velocity of the radiated wave, and π is the mathematic constant pi.

In certain implementations, the distance d is implemented to be about ½λ, where λ is the wavelength of the fundamental component of the transmit signal. In such implementations, the second phase shifter 130b can be controlled to provide a phase shift of about $-\pi\cos\theta$ radians to achieve a transmit beam angle θ.

Accordingly, the relative phase of the phase shifters 130a, 130b can be controlled to provide transmit beamforming. In certain implementations, a baseband processor and/or a transceiver (for example, the transceiver 105 of FIG. 4A) controls phase values of one or more phase shifters and gain values of one or more controllable amplifiers to control beamforming.

Figure 4C:
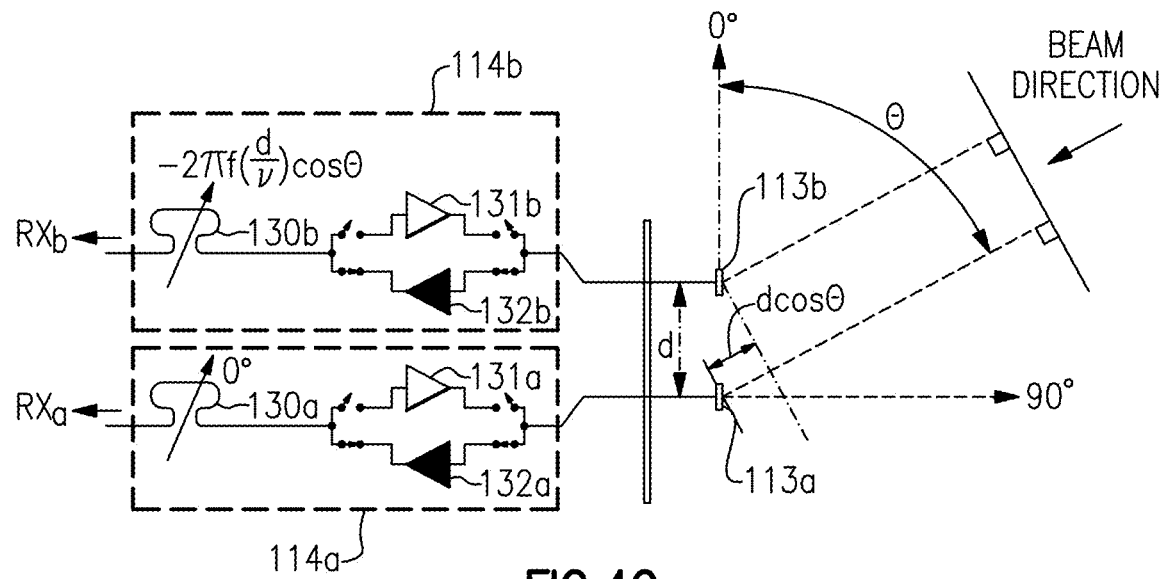
FIG. 4C is a schematic diagram of one example of beamforming to provide a receive beam.

FIG. 4C is a schematic diagram of one example of beamforming to provide a receive beam. FIG. 4C is similar to FIG. 4B, except that FIG. 4C illustrates beamforming in the context of a receive beam rather than a transmit beam.

As shown in FIG. 4C, a relative phase difference between the first phase shifter 130a and the second phase shifter 130b can be selected to about equal to $-2\pi f(d/v)\cos\theta$ radians to achieve a desired receive beam angle θ. In implementations in which the distance d corresponds to about ½λ, the phase difference can be selected to about equal to $-\pi\cos\theta$ radians to achieve a receive beam angle θ.

Although various equations for phase values to provide beamforming have been provided, other phase selection values are possible, such as phase values selected based on implementation of an antenna array, implementation of signal conditioning circuits, and/or a radio environment.

Figure 5A:
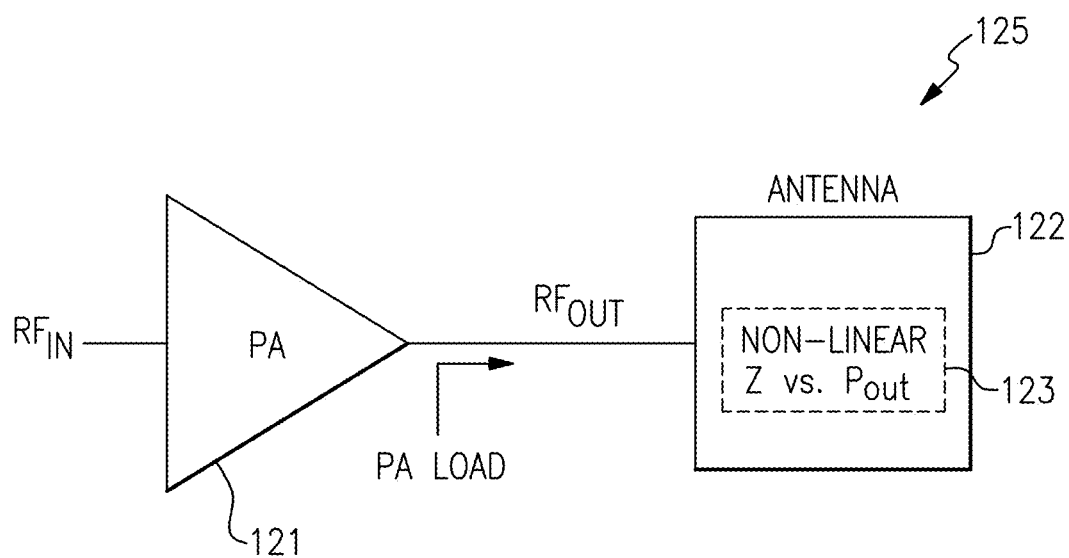
FIG. 5A is a schematic diagram of a power amplifier system according to one embodiment.

FIG. 5A is a schematic diagram of a power amplifier system 125 according to one embodiment. The power amplifier system 125 includes a power amplifier 121 and an antenna 122.

The power amplifier 121 amplifies an RF input signal $RF_{IN}$ to generate an RF output signal $RF_{OUT}$ that is provided to the antenna 122 for wireless transmission.

The output of the power amplifier 121 has an output load that is a function of output power. For example, as the power of the RF input signal $RF_{IN}$ changes (for instance, as the signal envelope varies), the power amplifier's load varies.

In the illustrated embodiment, the antenna 122 is intentionally implemented with a non-linear impedance versus output power characteristic 123 that compensates the power amplifier 121 for output load variation.

In certain embodiments, the power amplifier system 125 is included as part of a channel of a communication system that operates using beamforming. For example, the antenna 122 can be part of an antenna array, and the power amplifier 121 can be included in a signal conditioning circuit used to drive the antenna array. Thus, the power amplifier system 125 of FIG. 5A can be incorporated into a communication system such as that shown in FIGS. 4A to 4C. Furthermore, multiple instantiations or replications of the power amplifier system 125 can be included in such a communication system, for example, with a copy of the power amplifier system 125 included in each signal conditioning circuit used to drive the antenna array.

Figure 5B:
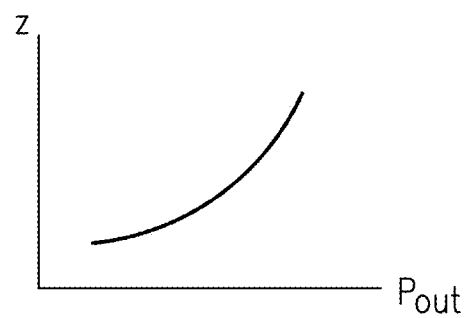
FIG. 5B is a graph of non-linear antenna impedance versus output power according to one embodiment.

FIG. 5B is a graph of non-linear antenna impedance versus output power according to one embodiment. In this example, impedance increases with output power in a non-linear manner. Moreover, impedance monotonically with output power, in this embodiment.

With reference to FIGS. 5A to 5B, in certain embodiments herein, the non-linear impedance versus output power characteristic 123 of the antenna 122 is selected to compensate the power amplifier 121 for a change in power amplifier load versus output power.

By implementing the power amplifier system 125 in this manner, the power amplifier 121 operates with better performance characteristics in the presence of changing signal power. For example, the power amplifier 121 can exhibit superior linearity and/or compression characteristics by implementing the antenna 122 with the non-linear impedance versus output power characteristic 123.

In certain embodiments, the antenna 122 is a patch antenna that is implemented (for instance, through selection of feeds, geometry, and/or metallization characteristics) to present a non-linear impedance versus output power characteristic to compensate for load variation of the power amplifier 121.

Figure 5C:
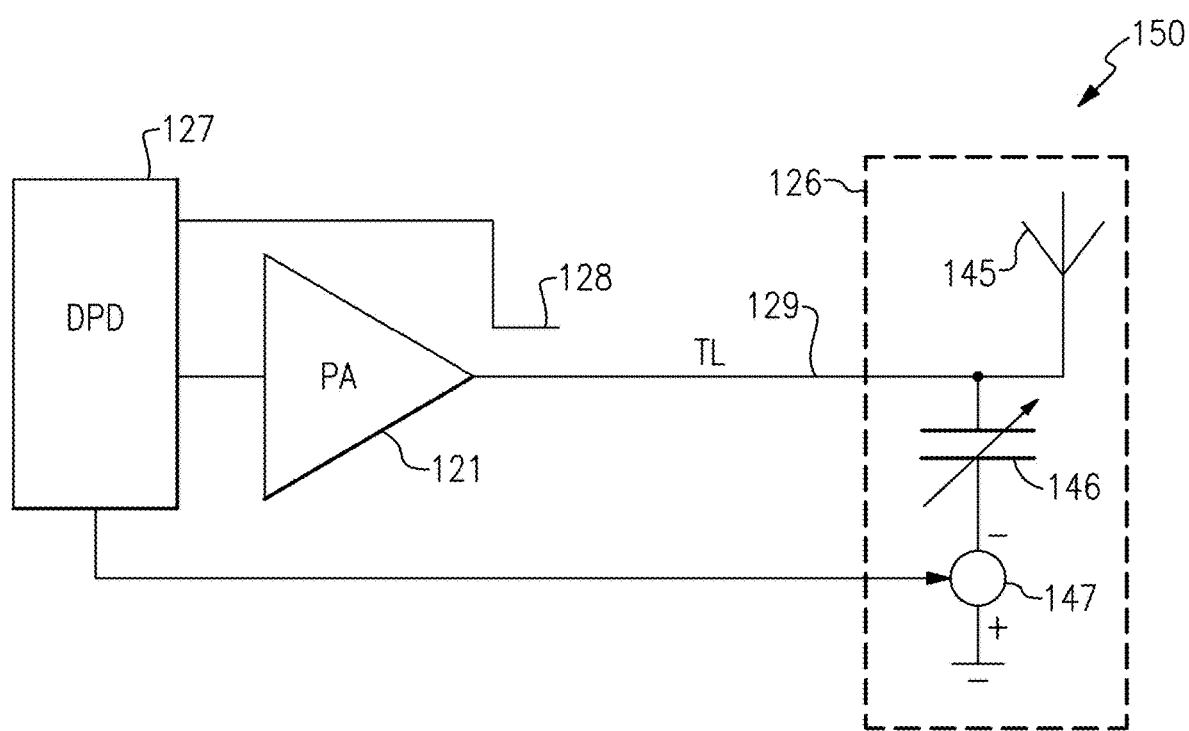
FIG. 5C is a schematic diagram of a power amplifier system according to another embodiment.

FIG. 5C is a schematic diagram of a power amplifier system 150 according to another embodiment. The power amplifier system 150 includes a power amplifier 121, an antenna 126, a digital pre-distortion (DPD) system 127, an RF coupler 128, and a transmission line (TL) 129.

As shown in FIG. 5C, the DPD system 127 generates an RF input signal to the power amplifier 121. The power amplifier 121 amplifies the RF input signal to generate an RF output signal that is provided to the antenna 126 along the transmission line 129. The RF coupler 128 senses an output of the power amplifier 121 to generate an observation signal for the DPD system 127.

The DPD system 127 can be incorporated as part of a transceiver, and serves to shape a digital representation of the RF input signal to compensate for non-linearity of the power amplifier 121. Thus, the RF input signal is shaped to compensate for non-linearity of the power amplifier 121 such that the RF output signal is linear. In this embodiment, the observation signal from the RF coupler 128 aids the DPD system 127 in determining an amount and type of shaping to apply to the digital representation of the RF input signal prior to conversion to the RF domain (for instance, using a digital-to-analog converter and a mixer for frequency upconversion).

The output of the power amplifier 121 has an output load that is a function of output power. For example, as the power of the RF input signal changes (for instance, as the signal envelope varies), the load of the power amplifier 121 varies.

In the illustrated embodiment, the antenna 126 is intentionally implemented with a non-linear impedance versus output power characteristic that compensates the power amplifier 121 for output load variation. In particular, the antenna 126 includes a linear antenna element 145, a controllable capacitor 146 (for example, a varactor), and a controllable DC bias voltage source 147 for controlling a DC bias voltage of the controllable capacitor 146. The controllable capacitor 146 and/or the controllable DC bias voltage 147 can be controlled by a transceiver, for example, using an antenna tuner and/or the DPD system 127 of the transceiver based on the power level of the RF output signal.

The non-linear impedance versus output characteristic is achieved by adjusting the capacitance of the controllable capacitor 146 to achieve a desired impedance characteristic. For example, the DPD system 127 can control the controllable capacitor 146 to increase impedance with output power in a non-linear manner. Accordingly, the DPD system 127 can improve linearity by receiving a coupled RF signal and controlling both the RF input to the PA and the voltage 147 on the controllable capacitor 146 (for instance, varactor).

In certain embodiments, the power amplifier system 150 is included as part of a channel of a communication system that operates using beamforming. For example, the antenna 126 can be part of an antenna array, and the power amplifier 121 can be included in a signal conditioning circuit used to drive the antenna array. Thus, the power amplifier system 150 of FIG. 5C can be incorporated into a communication system such as that shown in FIGS. 4A to 4C. Furthermore, multiple instantiations or replications of the power amplifier system 150 can be included in such a communication system, for example, with a copy of the power amplifier system 150 included in each signal conditioning circuit used to drive the antenna array.

Moreover, when used in a beamforming communication system, the capacitance setting of the controllable capacitor 146 (for example, varactor) can be selected as part of beamforming and tuning of the antenna array.

S-parameters of the power amplifier 121, such as S22, vary with power. To enhance power transfer between the power amplifier 121 and the antenna 126, certain embodiments herein match an imaginary impedance at the end of the transmission line 129 to the antenna 126.

Figure 6A:
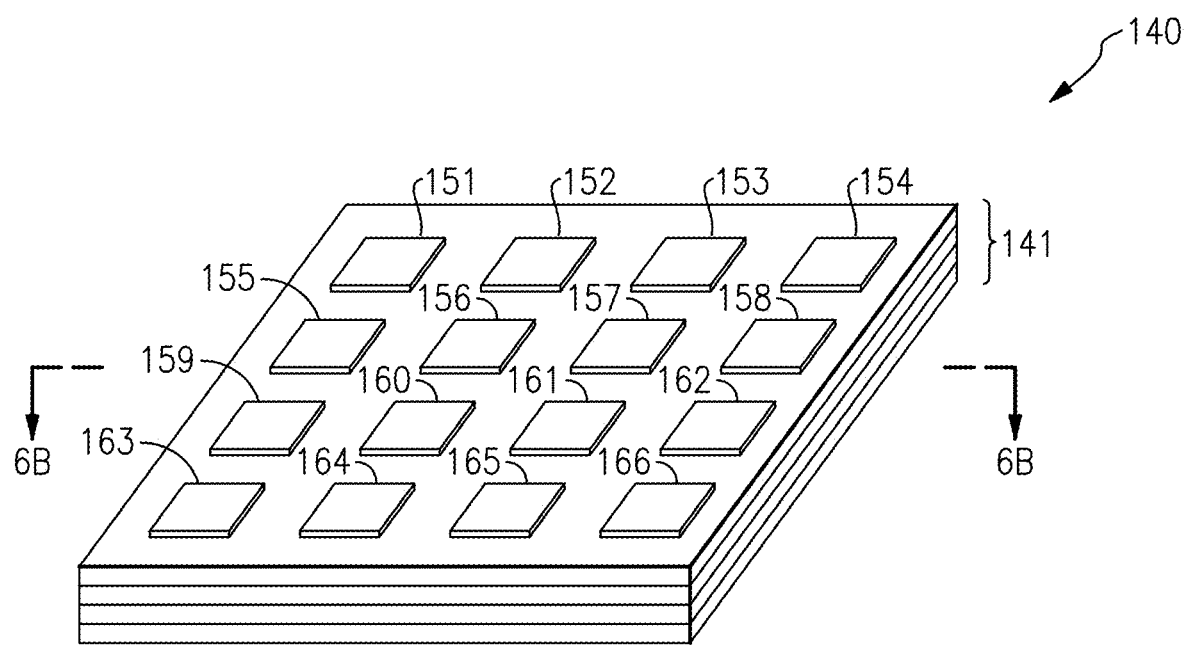
FIG. 6A is a perspective view of one embodiment of a module that operates with beamforming.
Figure 6B:
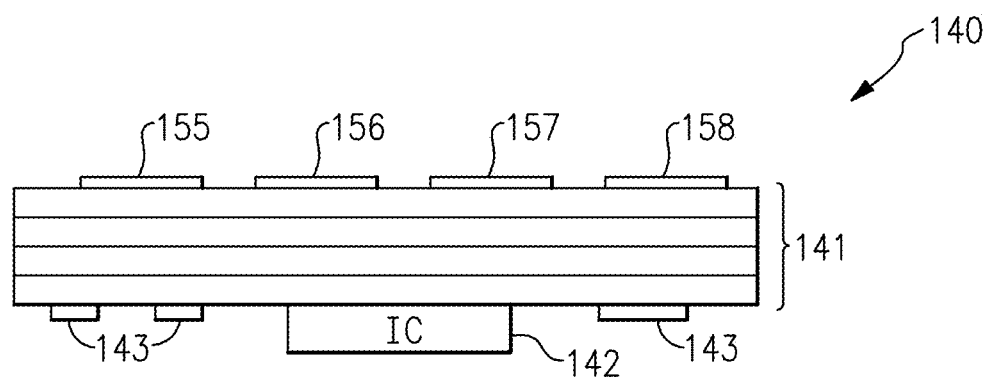
FIG. 6B is a cross-section of the module of FIG. 6A taken along the lines 6B-6B.

FIG. 6A is a perspective view of one embodiment of a module 140 that operates with beamforming. FIG. 6B is a cross-section of the module 140 of FIG. 6A taken along the lines 6B-6B.

The module 140 includes a laminated substrate or laminate 141, a semiconductor die or IC 142, surface mount components 143, and an antenna array including patch antenna elements 151-166.

Although one embodiment of a module is shown in FIGS. 6A and 6B, the teachings herein are applicable to modules implemented in a wide variety of ways. For example, a module can include a different arrangement of and/or number of antenna elements, dies, and/or surface mount components. Additionally, the module 140 can include additional structures and components including, but not limited to, encapsulation structures, shielding structures, and/or wirebonds.

In the illustrated embodiment, the antenna elements 151-166 are formed on a first surface of the laminate 141, and can be used to transmit and/or receive signals. Although the illustrated antenna elements 151-166 are rectangular, the antenna elements 151-166 can be shaped in other ways. Additionally, although a 4×4 array of antenna elements is shown, more or fewer antenna elements can be provided.

Moreover, antenna elements can be arrayed in other patterns or configurations. Furthermore, in another embodiment, multiple antenna arrays are provided, such as separate antenna arrays for transmit and receive and/or multiple antenna arrays for MIMO and/or switched diversity.

In certain implementations, the antenna elements 151-166 are implemented as patch antennas. A patch antenna can include a planar antenna element positioned over a ground plane. A patch antenna can have a relatively thin profile and exhibit robust mechanical strength. In certain configurations, the antenna elements 151-166 are implemented as patch antennas with planar antenna elements formed on the first surface of the laminate 141 and the ground plane formed using an internal conductive layer of the laminate 141.

Although an example with patch antennas is shown, a modulate can include any suitable antenna elements, including, but not limited to, patch antennas, dipole antennas, ceramic resonators, stamped metal antennas, and/or laser direct structuring antennas.

In the illustrated embodiment, the IC 142 and the surface mount components 143 are on a second surface of the laminate 141 opposite the first surface.

In certain implementations, the IC 142 includes signal conditioning circuits associated with the antenna elements 151-166. In one embodiment, the IC 142 includes a serial interface, such as a mobile industry processor interface radio frequency front-end (MIPI RFFE) bus and/or inter-integrated circuit (I2C) bus that receives data for controlling the signal conditioning circuits, such as the amount of phase shifting provided by phase shifters. In another embodiment, the IC 142 includes signal conditioning circuits associated with the antenna elements 151-166 and an integrated transceiver.

The laminate 141 can be implemented in a variety of ways, and can include for example, conductive layers, dielectric layers, solder masks, and/or other structures. The number of layers, layer thicknesses, and materials used to form the layers can be selected based on a wide variety of factors, which can vary with application. The laminate 141 can include vias for providing electrical connections to signal feeds and/or ground feeds of the antenna elements 151-166. For example, in certain implementations, vias can aid in providing electrical connections between signaling conditioning circuits of the IC 142 and corresponding antenna elements.

The module 140 can be included in a communication system, such as a mobile phone or base station. In one example, the module 140 is attached to a phone board of a mobile phone.

Figure 7:
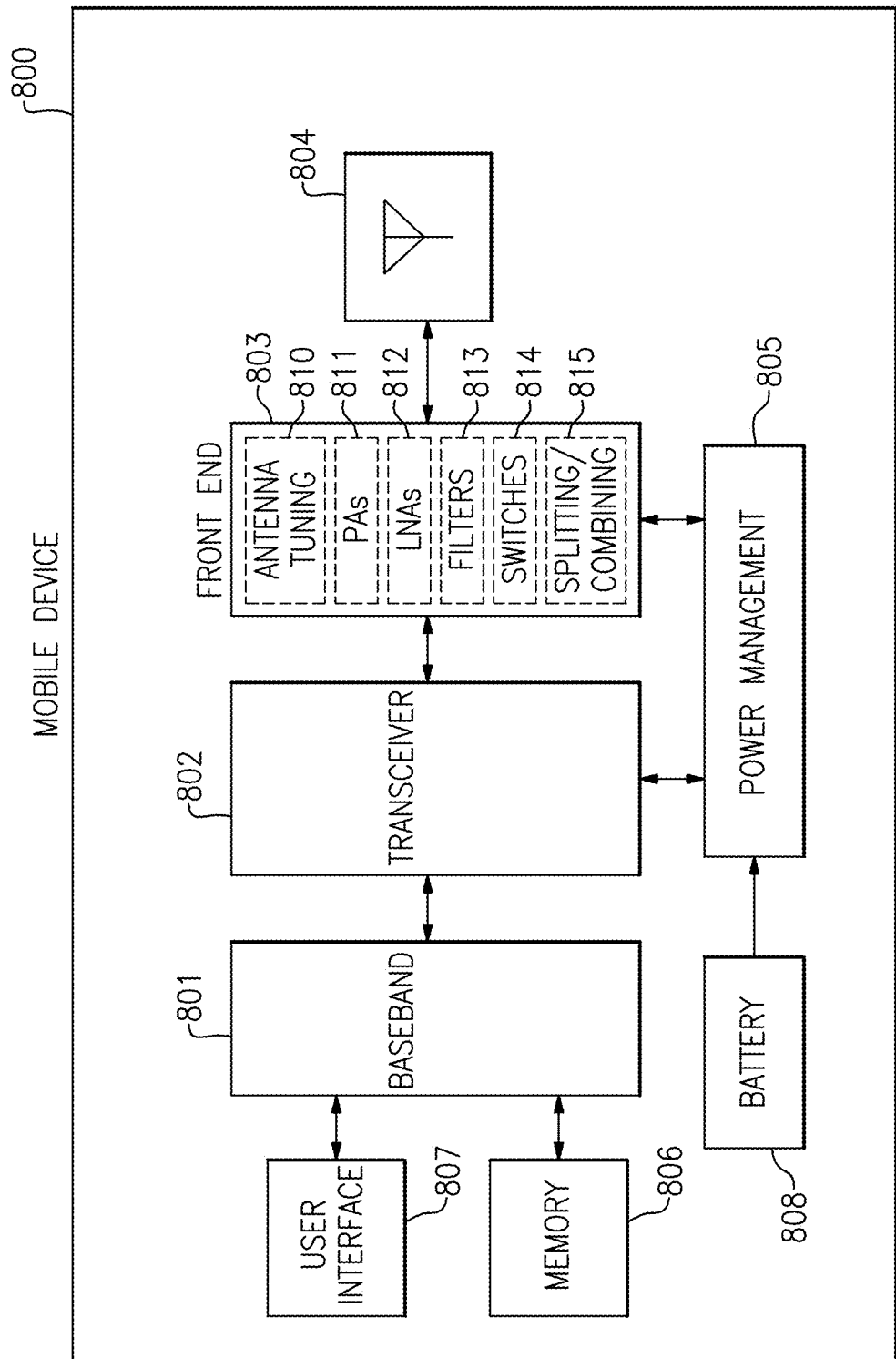
FIG. 7 is a schematic diagram of one embodiment of a mobile device.

FIG. 7 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 7 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 7, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 7, the power management system 805 receives a battery voltage from the battery 808. The battery 808 can be any suitable battery for use in the mobile device 800, including, for example, a lithium-ion battery.

Figure 8:
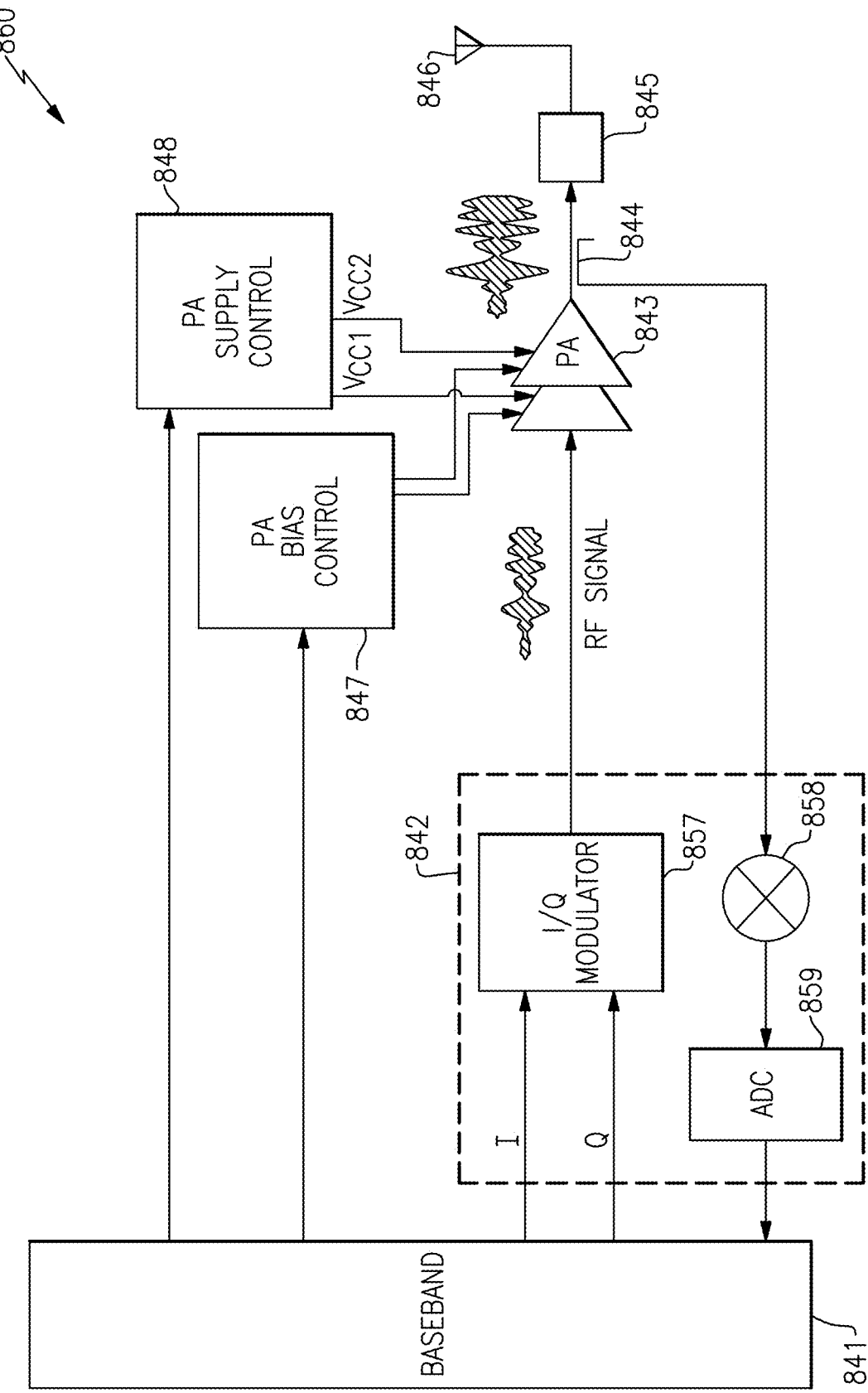
FIG. 8 is a schematic diagram of a power amplifier system according to another embodiment.

FIG. 8 is a schematic diagram of a power amplifier system 860 according to another embodiment. The illustrated power amplifier system 860 includes a baseband processor 841, a transmitter/observation receiver 842, a power amplifier (PA) 843, a directional coupler 844, front-end circuitry 845, an antenna 846, a PA bias control circuit 847, and a PA supply control circuit 848. The illustrated transmitter/observation receiver 842 includes an I/Q modulator 857, a mixer 858, and an analog-to-digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format. The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 841 can be included in the power amplifier system 860.

The I/Q modulator 857 can be configured to receive the I and Q signals from the baseband processor 841 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 843. In certain implementations, the I/Q modulator 857 can include one or more filters configured to filter frequency content of signals processed therein.

The power amplifier 843 can receive the RF signal from the I/Q modulator 857, and when enabled can provide an amplified RF signal to the antenna 846 via the front-end circuitry 845.

The front-end circuitry 845 can be implemented in a wide variety of ways. In one example, the front-end circuitry 845 includes one or more switches, filters, duplexers, multiplexers, and/or other components. In another example, the front-end circuitry 845 is omitted in favor of the power amplifier 843 providing the amplified RF signal directly to the antenna 846.

The directional coupler 844 senses an output signal of the power amplifier 823. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the power amplifier 843 to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a power amplifier is shown, other implementations are possible.

The PA supply control circuit 848 receives a power control signal from the baseband processor 841, and controls supply voltages of the power amplifier 843. In the illustrated configuration, the PA supply control circuit 848 generates a first supply voltage $V_{CC1}$ for powering an input stage of the power amplifier 843 and a second supply voltage $V_{CC2}$ for powering an output stage of the power amplifier 843. The PA supply control circuit 848 can control the voltage level of the first supply voltage $V_{CC1}$ and/or the second supply voltage $V_{CC2}$ to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 8, the PA bias control circuit 847 receives a bias control signal from the baseband processor 841, and generates bias control signals for the power amplifier 843. In the illustrated configuration, the bias control circuit 847 generates bias control signals for both an input stage of the power amplifier 843 and an output stage of the power amplifier 843. However, other implementations are possible.

Applications

Some of the embodiments described above have provided examples in connection with wireless devices or mobile phones. However, the principles and advantages of the embodiments can be used for any other systems or apparatus that have needs for power amplifier systems with non-linear antenna impedance.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
   a transceiver configured to generate a radio frequency input signal;
   a front end system including a power amplifier configured to amplify the radio frequency input signal to generate a radio frequency output signal; and
   an antenna configured to transmit the radio frequency output signal, the antenna having a non-linear impedance versus output power characteristic operable to compensate the power amplifier for a change in output load in response to a change in signal power, the antenna including an antenna element, a controllable capacitor connected to the antenna element, and a controllable voltage source in series with the controllable capacitor, the transceiver configured to adjust a capacitance of the controllable capacitor to provide the non-linear impedance versus output power characteristic, and the transceiver including a digital pre-distortion system configured to shape a digital representation of the radio frequency input signal and to adjust a voltage level of the controllable voltage source.

2. The mobile device of claim 1 wherein the antenna is a patch antenna implemented to provide the non-linear impedance versus output power characteristic.

3. The mobile device of claim 1 wherein the non-linear impedance of the antenna monotonically increases with a power level of the power amplifier.

4. The mobile device of claim 1 further comprising a power management system operable to provide a power amplifier supply voltage to the power amplifier.

5. The mobile device of claim 4 wherein the power management system is further operable to control the power amplifier supply voltage to track an average power of the radio frequency input signal.

6. The mobile device of claim 4 wherein the power management system is further operable to control the power amplifier supply voltage based on an envelope of the radio frequency input signal.

7. The mobile device of claim 1 further comprising an antenna array including the antenna.

8. The mobile device of claim 7 wherein the front end system is configured to provide a plurality of radio frequency output signals to the antenna array to form a transmit beam.

9. The mobile device of claim 1 wherein the front end system further includes a transmission line connected between an output of the power amplifier and the antenna, an imaginary impedance component of the transmission line matched to an impedance of the antenna.

10. A method of power amplification in a mobile device, the method comprising:
    generating a radio frequency input signal using a transceiver;
    amplifying the radio frequency input signal to generate a radio frequency output signal using a power amplifier;
    transmitting the radio frequency output signal using an antenna, including compensating the power amplifier for a change in output load in response to a change in signal power using a non-linear impedance versus output power characteristic of the antenna, the antenna including an antenna element, a controllable capacitor connected to the antenna element, and a controllable voltage source in series with the controllable capacitor;
    adjusting a capacitance of the controllable capacitor using the transceiver to provide the non-linear impedance versus output power characteristic; and
    using a digital pre-distortion system of the transceiver to shape a digital representation of the radio frequency input signal and to adjust a voltage level of the controllable voltage source.

11. The method of claim 10 wherein the antenna is a patch antenna.

12. The method of claim 10 further comprising monotonically increasing the non-linear impedance of the antenna with a power level of the power amplifier.

13. The method of claim 10 further comprising providing a power amplifier supply voltage to the power amplifier from a power management system.

14. The method of claim 10 wherein an antenna array includes the antenna, the method further comprising providing a plurality of radio frequency output signals to the antenna array to form a transmit beam.

15. A radio frequency module comprising:
    a package substrate;
    a semiconductor die attached to the package substrate and including a transceiver configured to generate a radio frequency input signal and a power amplifier configured to amplify the radio frequency input signal to generate a radio frequency output signal; and
    an antenna attached to the package substrate and configured to transmit the radio frequency output signal, the antenna having a non-linear impedance versus output power characteristic operable to compensate the power amplifier for a change in output load in response to a change in signal power, the antenna including an antenna element, a controllable capacitor connected to the antenna element, and a controllable voltage source in series with the controllable capacitor, the transceiver configured to adjust a capacitance of the controllable capacitor to provide the non-linear impedance versus output power characteristic, and the transceiver including a digital pre-distortion system configured to shape a digital representation of the radio frequency input signal and to adjust a voltage level of the controllable voltage source.

16. The radio frequency module of claim 15 wherein the antenna is a patch antenna implemented to provide the non-linear impedance versus output power characteristic.

17. The radio frequency module of claim 15 further comprising an antenna array attached to the package substrate, the antenna array including the antenna.

18. The radio frequency module of claim 17 wherein the semiconductor die is configured to provide a plurality of radio frequency output signals to the antenna array to form a transmit beam.

19. The radio frequency module of claim 15 wherein the non-linear impedance of the antenna monotonically increases with a power level of the power amplifier.

20. The radio frequency module of claim 15 further comprising a transmission line connected between an output of the power amplifier and the antenna, an imaginary impedance component of the transmission line matched to an impedance of the antenna.

* * * * *